(12) United States Patent
Chen et al.

(10) Patent No.: US 7,207,339 B2
(45) Date of Patent: Apr. 24, 2007

(54) METHOD FOR CLEANING A PLASMA ENHANCED CVD CHAMBER

(75) Inventors: Sheng-Wen Chen, Shinjuang (TW); Shiu-Ko Jangjian, Fengshan (TW); Hung-Jui Chang, Shetou Shiang (TW); Ying-Lang Wang, Lungjing Shiang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 269 days.

(21) Appl. No.: 10/738,740

(22) Filed: Dec. 17, 2003

(65) Prior Publication Data

US 2005/0133059 A1 Jun. 23, 2005

(51) Int. Cl.
*B08B 9/00* (2006.01)
*B08B 6/00* (2006.01)

(52) U.S. Cl. ............... 134/1.1; 134/22.1; 134/26; 134/902; 438/905

(58) Field of Classification Search ........... 134/1.1, 134/1.2, 26, 902, 22.1, 2; 438/905
See application file for complete search history.

(56) References Cited

U.S. PATENT DOCUMENTS

| | | | | |
|---|---|---|---|---|
| 5,620,526 | A * | 4/1997 | Watatani et al. | 134/1.1 |
| 5,882,423 | A * | 3/1999 | Linn et al. | 134/1.1 |
| 6,584,987 | B1 * | 7/2003 | Cheng et al. | 134/1.1 |
| 6,767,836 | B2 * | 7/2004 | San et al. | 438/710 |
| 6,843,858 | B2 * | 1/2005 | Rossman | 134/30 |

* cited by examiner

*Primary Examiner*—Michael Barr
*Assistant Examiner*—Saeed Chaudhry
(74) *Attorney, Agent, or Firm*—Tung & Associates

(57) ABSTRACT

A method for plasma cleaning a CVD reactor chamber including providing a plasma enhanced CVD reactor chamber comprising residual deposited material; performing a first plasma process comprising an oxygen containing plasma; performing a second plasma process comprising an argon containing plasma; and, performing a third plasma process comprising a fluorine containing plasma.

20 Claims, 1 Drawing Sheet

METHOD FOR CLEANING A PLASMA ENHANCED CVD CHAMBER

FIELD OF THE INVENTION

This invention generally relates to semiconductor device manufacturing methods and more particularly to a method for plasma cleaning a plasma enhanced CVD reactor chamber to improve CVD film deposition uniformity while reducing manufacturing and environmental costs.

BACKGROUND OF THE INVENTION

In forming multi-level integrated circuit devices, a major portion of the manufacturing cycle involves chemical vapor deposition (CVD), for example plasma enhanced CVD (PECVD) and high density plasma CVD (HDP-CVD), to deposit material layers. In particular, the depositing of oxide insulating layers, also referred to as inter-metal dielectric (IMD) layers, is performed several times in the formation of a multi-level integrated circuit device.

Generally, the formation of IC devices involves a major effort in forming multiple levels of wiring, also referred to as damascene structures, which are formed by backfilling metals, for example copper, into openings etched into IMD layers.

Increasingly, low-K (dielectric constant) IMD layers are required to reduce signal delay and power loss effects as IC devices are scaled down in size. One way this has been accomplished has been to introduce porosity or dopants into a silicon oxide dielectric insulating layer, also referred to as an inter-metal dielectric (IMD) layer. Increasingly, low-K silicon oxide based materials are formed using organo-silane precursors in a PECVD or HDP-CVD process to form porous organo-silicate glass (OSG) IMD layers having dielectric constants less than about 3.2.

One problem with PECVD and HDP-CVD processes is the formation of coatings of IMD layer deposition material over surfaces within the plasma reactor. The formation of residual deposition material becomes a problem in subsequent CVD depositions in several respects including flaking off of the residual deposition material onto the process wafer during a PECVD deposition process thereby introducing defects into a newly deposited CVD layer, for example an IMD layer. In addition, the presence of dopants, such as fluorine in prior art processes has tended to cause problems in subsequent depositions of non-doped IMD layers by undesirably introducing fluorine contaminants due to interaction of the deposition plasma with the residual deposition material within the chamber.

The most obvious and reliable solution to the problems presented by residual deposition materials in a plasma reactor chamber is to perform preventative maintenance, or cleaning of the plasma reactor chamber on a frequent basis. However, the down time of the plasma reactor chamber and the labor intensive requirements for manual preventative maintenance functions increases the cost of manufacture proportionate to the frequency of such required maintenance. Several approaches in the prior art have sought to alleviate the cost of preventative maintenance by depositing protective coatings over the accumulated coatings at periodic times to reduce interaction of the residual deposited material with the plasma and extend the preventative maintenance life-cycle. Unfortunately this approach makes the cleaning processes more difficult as the protective coatings are generally more resistant to cleaning processes, including plasma cleaning processes, requiring the use of fluorocarbons for effective cleaning.

For example, in plasma cleaning processes of the prior art fluorine containing gases, including fluorocarbons and hydrofluorocarbons, are used to form a plasma in a plasma cleaning process to remove residual deposition material by periodically etching away a portion of the accumulated coating material. This approach has its own drawbacks, including the cost of the fluorine containing cleaning gases, both in terms of manufacturing cost and environmental cost, and incomplete cleaning of the residual deposition material. For example, the use of fluorocarbons are generally discouraged and an increasing number are, or will be, subject to regulation limiting their use due to detrimental environmental effects, for example, associated with global warming effects as well as deterioration of the UV protective ozone layer of Earth's atmosphere.

Although prior art plasma reactor chamber cleaning processes have included the use of alternative fluorine containing gases, the cost of such gases remains significant, and fluorocarbons are still generally used to achieve more complete cleaning of the residual deposition materials. Additional problems related to the use of fluorine containing gases in a plasma cleaning operation includes undesired reaction of fluorine radicals with residual deposition material which can operate to reduce the effectiveness of the cleaning operation and contribute to subsequent non-uniform CVD layer deposition and particulate contamination.

There is therefore a need in the integrated circuit manufacturing art to develop a plasma cleaning process for plasma enhanced CVD reactor chambers whereby residual deposition material is more effectively removed to increase a subsequent CVD deposited film uniformity while reducing manufacturing and environmental costs.

It is therefore among the objects of the present invention to provide a plasma cleaning process for plasma enhanced CVD reactor chambers whereby residual deposition material is more effectively removed to increase a subsequent CVD deposited film uniformity while reducing manufacturing and environmental costs, in addition to overcoming other shortcomings of the prior art.

SUMMARY OF THE INVENTION

To achieve the foregoing and other objects, and in accordance with the purposes of the present invention, as embodied and broadly described herein, the present invention provides a method for plasma cleaning a CVD reactor chamber.

In a first embodiment, the method includes providing a plasma enhanced CVD reactor chamber comprising residual deposited material; performing a first plasma process comprising an oxygen containing plasma; performing a second plasma process comprising an argon containing plasma; and, performing a third plasma process comprising a fluorine containing plasma.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to an exemplary CVD plasma reactor, it will be appreciated that the method of the present invention applies generally to CVD plasma reactors whereby the improved plasma cleaning process according to embodiments of the present invention are used to reduce the usage of fluorine containing gases in the cleaning process including eliminating the use of fluorocarbons, while improving a plasma cleaning operation to reduce particulate contamination and improve a subsequent deposited CVD film uniformity.

Figure 1:
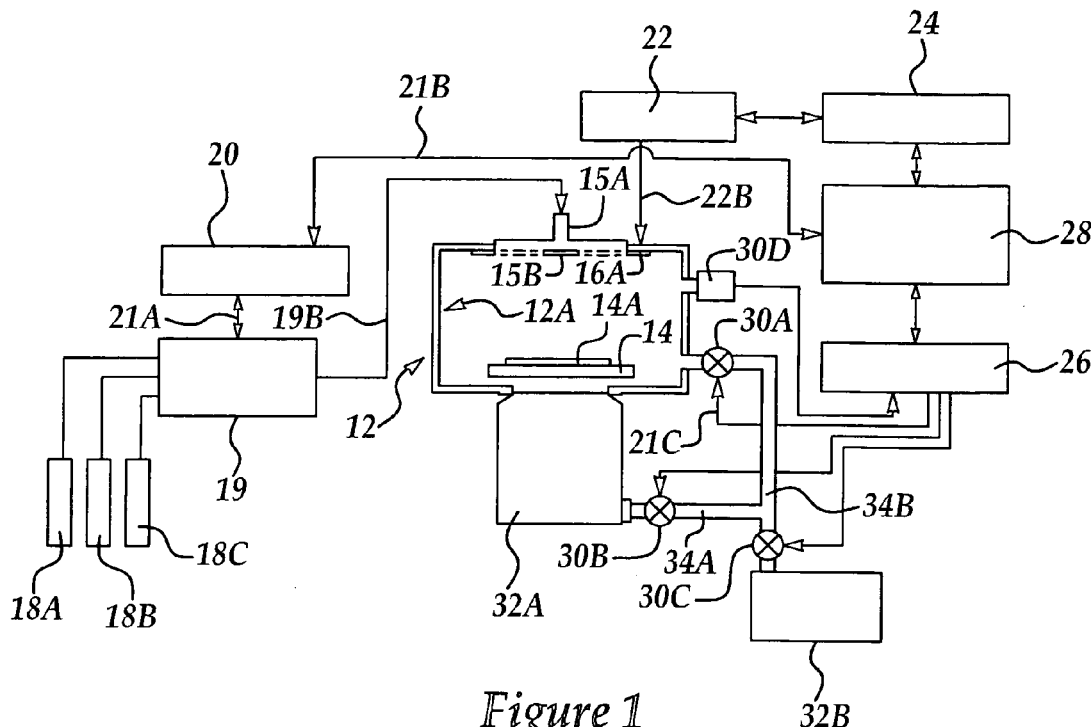
FIG. 1 is a schematic view of an exemplary PECVD reactor for use in exemplary implementation of the plasma cleaning process according to embodiments of the present invention.

Referring to FIG. 1 is shown an exemplary PECVD reactor to illustrate embodiments of the plasma cleaning process according to embodiments of the present invention. Shown is a plasma reactor chamber 12 including wall portions e.g., 12A where a film of residual deposition material forms following a conventional PECVD deposition process. It will be appreciated that the film of residual deposition material may form over all exposed surfaces within the reactor chamber including a wafer support (electrostatic chuck) 14 (including an RF power electrode), for holding a process wafer e.g., 14A. It will be appreciated that the process wafer is not present during the plasma cleaning process explained below. Preferably, the reactor chamber 12 is a cold wall reactor (e.g., no heating elements), although it will be appreciated that the method of the present invention may be used with either a cold wall or a hot (heated) wall plasma reactor chamber. In addition, it will be appreciated that the plasma source gases may be remotely excited outside the chamber in a waveguide portion prior to entering into the plasma reactor chamber in a downstream plasma process, for example the plasma excited by a microwave source e.g., 2.45 GHz in a waveguide portion upstream from the reactor chamber, such reactors being known in the art.

Still referring to FIG. 1, plasma source gases e.g., 18A, 18B, 18C, are fed through a conventional gas panel 19 including flow controllers (not shown) and valves (not shown) controlled by a gas flow controller 20 shown in 2-way communication with the gas panel 19 shown by directional arrow 21A and in 2-way communication with microcontroller 28 shown by directional arrow 21B. The plasma source gases are typically fed to an upper portion of the plasma reactor chamber 12 e.g., via gas supply line 19B through a gas inlet 15A communicating with a gas dispersion plate 15B. RF power is supplied to electrodes 16A at the upper portion of the chamber and electrostatic chuck 14 which includes a power RF electrode plate. The RF power is supplied to the upper electrode 16A and lower electrode e.g., 14 through a matching RF network 22 via one-way communication line e.g., 22B and supplied with power by RF generator 24. RF generator 24, gas flow controller 20 and pressure controller 26 are controlled by microcontroller 28 in 2-way communication including an operator interface. For example, as is known in the art, the pressure controller 26 is in 1-way communication (e.g., command receiving line 21C) with and valves 30A, 30B, and 30C which are controlled to open or close in response to sensed pressure of the reactor chamber 12 e.g., via pressure sensor 30D. The reactor chamber 12 pressure is controlled by operation of turbomolecular pump 32A, roughing pump 32B, together with selected open and closed conditions of the respective valves 30A, 30B, and 30C to communicate with exhaust line 34A and roughing bypass exhaust line 34B to achieve a deposition pressure at a selected plasma source gas flow rate.

According to an embodiment of the present invention, a plasma reactor cleaning process is carried out following accumulation of residual deposition material within the reactor chamber 12. In one embodiment of the invention, preferably a 3-step cleaning process is carried out. In a first step, an oxygen plasma treatment is first carried out. A plasma source gas including oxygen ($O_2$), preferably consisting primarily of $O_2$ for example at a concentration of greater than about 80 volume % (with respect to a plasma treatment volume), more preferably greater than about 90 volume %, is provided to the plasma reactor and an oxygen plasma created to treat the accumulated deposition material for a first period of time. It will be appreciated that an inert gas, such as argon or helium, may make up a remaining volume %, if any, of the plasma source gas. In an important aspect of the invention, preferably the oxygen plasma is free of nitrogen and fluorine. Exemplary plasma conditions include an RF power of from about 100 Watts to about 2000 Watts, more preferably in a range of about 200 Watts to about 1000 Watts. The plasma operating pressure is preferably in a range of about 100 mTorr to about 10 Torr, more preferably from about 1 Torr to about 5 Torr. The oxygen ($O_2$) gas flow rate, for example, is provided at a flow rate of about 100 sccm to about 500 sccm. The oxygen plasma treatment is preferably carried out for a period of about 3 seconds to about 10 seconds.

In a second step of the plasma reactor cleaning process, following the oxygen plasma treatment, an argon plasma treatment is carried out. A plasma source gas including argon (Ar) preferably consisting primarily of Ar, for example at a concentration of greater than about 80 volume % (with respect to a plasma treatment volume), more preferably greater than about 90 volume %, is provided to the plasma reactor and an argon plasma created to treat the accumulated deposition material for a second period of time. It will be appreciated that an inert gas, such as helium, or nitrogen, may make of a remaining volume %, if any, of the plasma source gas. In an important aspect of the invention, preferably the argon plasma is free of nitrogen and fluorine. Exemplary plasma conditions include an RF power of from about 100 Watts to about 2000 Watts, more preferably in a range of about 200 Watts to about 1000 Watts. The plasma operating pressure is preferably in a range of about 100 mTorr to about 10 Torr, more preferably from about 1 Torr to about 5 Torr. The argon gas flow rate, for example, is provided at a flow rate of about 100 sccm to about 800 sccm. The argon plasma treatment is preferably carried out for a period of about 6 seconds to about 15 seconds.

In a third step of the plasma reactor cleaning process, following the argon plasma treatment, a fluorine containing plasma treatment, preferably a nitrogen trifluoride ($NF_3$) plasma treatment, is carried out. A plasma source gas including $NF_3$ preferably consisting primarily of $NF_3$, for example at greater than about 90 volume % (with respect to a plasma treatment volume), more preferably greater than about 95 volume %, is provided to the plasma reactor and a plasma created to treat the accumulated deposition material for a third period of time. It will be appreciated that an inert gas, preferably nitrogen or argon may make of a remaining volume %, if any, off the plasma source gas. Exemplary plasma conditions include an RF power of from about 100 Watts to about 2000 Watts, more preferably in a range of about 200 Watts to about 1000 Watts. The plasma operating pressure is preferably in a range of about 10 mTorr to about 10 Torr, more preferably from about 100 mTorr to about 5 Torr. The $NF_3$ gas flow rate, for example, is provided at a flow rate of about 100 sccm to about 500 sccm. The $NF_3$ plasma treatment is preferably carried for a period of about 6 seconds to about 15 seconds.

In one embodiment of the present invention, the accumulated deposition material within the plasma reactor chamber for cleaning includes organo-silane precursors for depositing organo-silicate glass (OSG) layers, e.g., IMD layers. The organo-silane precursors for example, include methylsilanes, including tetramethylsilane and trimethylsilane. In addition, organo-siloxane precursors such as organo-siloxanes including cyclo-tetra-siloxanes such as tetramethylcyclotetrasiloxane, octamethylcyclotetrasiloxane, and decamethylcyclopentasiloxane are also advantageously treated according to the 3-step cleaning process of the present invention. It will additionally be appreciated that the cleaning of nitride materials such as silicon nitride and/or silicon oxynitride materials may be improved by the 3-step plasma cleaning process according to preferred embodiments.

For example, according to embodiments of the present invention, is has been found that unreacted (incompletely reacted) organo-silane (or organo-siloxane) precursors, for example trimethylsilane (TMS), form a portion of the residual deposition materials coating the inside of reactor chamber surfaces following deposition of low-K material OSG layers, e.g., IMD layers in a multi-level integrated circuit manufacturing process. Carrying out a plasma cleaning process with nitrogen and/or fluorine radical, for example using $NF_3$ as a first step will cause both nitrogen and fluorine radicals to react with the incompletely reacted organo-silane and/or organo siloxane portions of the residual deposition material to form nitrogen and fluorine bonds to create a composition that may be represented by e.g., NFSiOC:H.

The addition of nitrogen and fluorine to the residual deposition layers within the reactor has been found to make the residual deposition layers more difficult to remove (e.g., a higher etching resistance) in the $NF_3$ cleaning process. As a result, portions of the residual deposition layer may remain following a cleaning process thereby detrimentally affecting subsequent film deposition uniformity and increasing particulate contamination of subsequently deposited OSG films. For example, it has been found that an incomplete plasma cleaning process leaving portions of the residual deposition material including portions having reacted with nitrogen and fluorine radicals to form e.g., NFSiOC:H, can subsequently react with a plasma in a subsequent deposition process to alter the deposition plasma chemistry and thereby detrimentally affect the uniformity of a subsequently PECVD deposited OSG layer onto a process wafer. In addition, residual deposition material remaining from incomplete plasma cleaning processes more readily contributes to early peeling and flaking during a PECVD deposition process to increase the incidence of particulate contamination.

According to the present invention, by first carrying out an oxygen plasma treatment, preferably free of nitrogen and fluorine, unreacted (e.g., incompletely reacted) organo-silane precursors present in the residual deposition material are substantially reacted with oxygen to form an OSG type material which is less susceptible to the formation of nitrogen and fluorine bonds in an $NF_3$ plasma cleaning step. As a result, the OSG material is resistant to nitrogen and fluorine bond formation in a subsequent $NF_3$ plasma cleaning step and is therefore easier to remove, allowing more complete removal at shorter plasma cleaning time periods. In addition, the argon plasma treatment step following the oxygen plasma treatment step advantageously operates to bombard the residual deposited OSG residual deposition material with a relatively higher impact energy which is believed to aid in the more complete removal of incompletely reacted organo-silane and/or organo-siloxane precursor portions as well as increasing the plasma reaction surface area of the residual deposition layers by creating a roughened surface.

Figure 2:
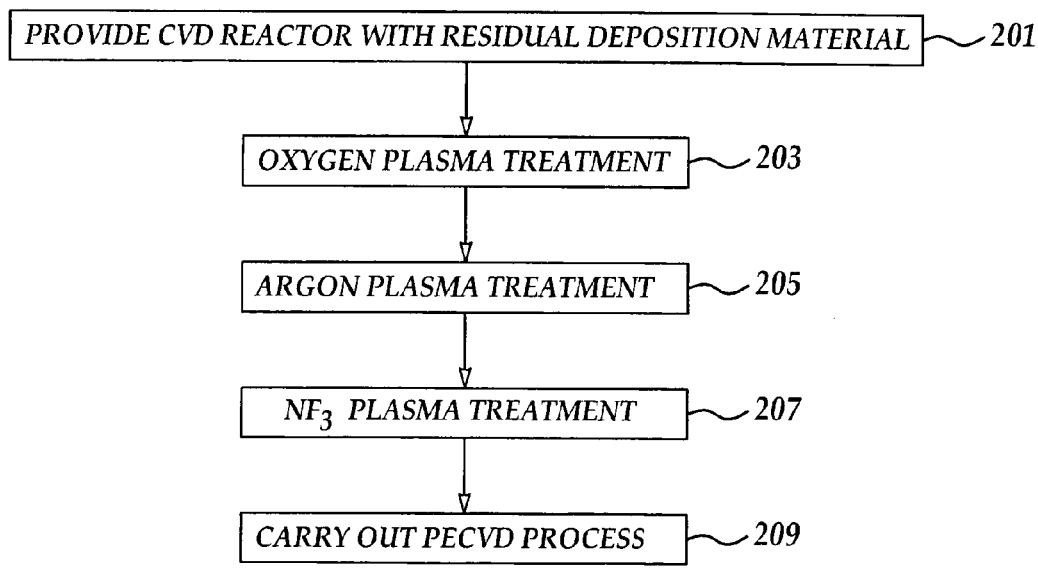
FIG. 2 is a process flow diagram including several embodiments of the present invention.

As a result, in the third step of the cleaning process, an $NF_3$ plasma treatment is carried out more effectively, leaving Referring to FIG. 2 is shown a process flow diagram including several embodiments of the present invention. In process 201, a plasma enhanced CVD deposition reactor chamber including residual deposition material including at least one of organo-silane and organo-siloxane precursors is provided. In process 203, a first step in a plasma cleaning process is carried out including an oxygen plasma treatment according to preferred embodiments. In process 205, a second step in a plasma cleaning process is carried out including an argon plasma treatment according to preferred embodiments. In process 207, a third step in a plasma cleaning process is carried out including an $NF_3$ plasma treatment according to preferred embodiments. In process 209, a plasma enhanced CVD deposition process using at least one of organo-silane and organo-siloxane precursors is carried out.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma cleaning a CVD reactor chamber to reduce a required cleaning time and an amount of fluorine containing gas comprising the steps of:

providing a plasma enhanced CVD reactor chamber comprising residual deposited material and a plasma treatment volume;

performing a first plasma process comprising an oxygen containing plasma formed from plasma source gases free of nitrogen and fluorine;

performing a second plasma process comprising an argon containing plasma following said first plasma process; and, performing a third plasma process comprising a fluorine containing plasma following said second plasma process.

2. The method of claim 1, wherein the third plasma process comprises a plasma source gas comprising nitrogen trifluoride ($NF_3$).

3. The method of claim 2, wherein the plasma source gas comprises greater than about 90% by volume of nitrogen trifluoride ($NF_3$) with respect to said plasma treatment volume.

4. The method of claim 2, wherein the plasma source gas consists essentially of nitrogen trifluoride ($NF_3$).

5. The method of claim 1, wherein the first plasma process plasma source gases comprise greater than about 80% by volume of oxygen ($O_2$) with respect to said plasma treatment volume.

6. The method of claim 5, wherein the second plasma process comprises a plasma formed from plasma source gases free of nitrogen and fluorine.

7. The method of claim 1, wherein the first plasma process plasma source gases comprises an inert gas selected from the group consisting of argon and helium.

8. The method of claim 1, wherein the first plasma process source gases consist essentially of oxygen ($O_2$) gas.

9. The method of claim 1, wherein the second plasma process comprises a plasma formed front plasma source gases comprising argon at greater than about 90% by volume with respect to said plasma treatment volume.

10. The method of claim 1, wherein the second plasma process comprises a plasma formed from a plasma source gas consisting essentially of argon.

11. The method of claim 1, wherein the residual deposited material comprises material selected from the group consisting of organo-silanes, organo-siloxanes, and organo-silicate glass (OSG).

12. The method of claim 1, wherein the plasma enhanced CVD reactor chamber comprises one of a PECVD, HDP-CVD, and downstream plasma reactor chamber.

13. A method for plasma cleaning a CVD reactor chamber to reduce a required cleaning time and an amount of fluorine containing gas comprising the steps of:
    providing a plasma enhanced CVD reactor chamber comprising residual deposited material and a plasma treatment volume;
    performing a first plasma process comprising an oxygen containing plasma formed from plasma source gases free of fluorine and nitrogen;
    performing in-situ following said first plasma process a second plasma process comprising an argon containing plasma formed from plasma source gases free of fluorine and nitrogen; and,
    performing in-situ following said second plasma process a third plasma process comprising a plasma formed from a nitrogen-fluoride ($N_xF_y$) containing plasma source gas.

14. The method of claim 13, wherein the nitrogen-fluoride containing plasma source gas comprises nitrogen trifluoride ($NF_3$) at greater than about 90% by volume with respect to said plasma treatment volume.

15. The method of claim 13, wherein the first plasma process plasma source gases comprise greater than about 80% by volume of oxygen ($O_2$) with respect to said plasma treatment volume.

16. The method of claim 15, wherein the first plasma process plasma source gases consists essentially of oxygen ($O_2$).

17. The method of claim 13, wherein the second plasma process plasma source gases comprise argon at greater than about 90% by volume with respect to said plasma treatment volume.

18. The method of claim 13, wherein the second plasma process plasma source gases consist essentially of argon.

19. The method of claim 13, wherein the residual deposited material comprises material selected from the group consisting of organo-silanes, organo-siloxanes, and organo-silicate glass (OSG).

20. The method of claim 13, wherein the plasma enhanced CVD reactor chamber comprises one of a PECVD, HDP-CVD, and downstream plasma reactor chamber.

* * * * *